United States Patent
Davies et al.

[11] Patent Number: 5,612,244
[45] Date of Patent: Mar. 18, 1997

[54] INSULATED GATE SEMICONDUCTOR DEVICE HAVING A CAVITY UNDER A PORTION OF A GATE STRUCTURE AND METHOD OF MANUFACTURE

[75] Inventors: Robert B. Davies, Tempe; Andreas A. Wild, Scottsdale, both of Ariz.

[73] Assignee: Motorola, Inc., Schaumburg, Ill.

[21] Appl. No.: 408,657

[22] Filed: Mar. 21, 1995

[51] Int. Cl.⁶ .......................... H01L 21/265; H01L 21/70; H01L 27/00

[52] U.S. Cl. .................................. 437/57; 437/41; 437/44; 437/45

[58] Field of Search .............................. 437/29, 34, 40 R, 437/40 GS, 41 R, 41 GS, 44, 45, 57

[56] References Cited

U.S. PATENT DOCUMENTS

| | | |
|---|---|---|
| 4,619,038 | 10/1986 | Pintchovski . |
| 4,949,136 | 8/1990 | Jain . |
| 4,968,639 | 11/1990 | Bergonzoni . |
| 5,170,232 | 12/1992 | Narita . |
| 5,372,960 | 12/1994 | Davies et al. . |
| 5,374,575 | 12/1994 | Kim et al. .................. 437/57 |
| 5,391,508 | 2/1995 | Matsuoka et al. .......... 437/44 |
| 5,427,964 | 6/1995 | Kaneshiro et al. .......... 437/45 |

FOREIGN PATENT DOCUMENTS

| | | |
|---|---|---|
| 0387722 | 9/1990 | European Pat. Off. . |
| 56-33881 | 4/1981 | Japan . |
| 63-44769 | 2/1988 | Japan . |
| 4154171 | 5/1992 | Japan . |

*Primary Examiner*—Mary Wilczewski
*Assistant Examiner*—Brian K. Dutton
*Attorney, Agent, or Firm*—Rennie William Dover

[57] ABSTRACT

An insulated gate field effect transistor (10) having an reduced gate to drain capacitance and a method of manufacturing the field effect transistor (10). A dopant well (13) is formed in a semiconductor substrate (11). A gate oxide layer (26) is formed on the dopant well (13) wherein the gate oxide layer (26) and a gate structure (41) having a gate contact portion (43) and a gate extension portion (44). The gate contact portion (43) permits electrical contact to the gate structure (41), whereas the gate extension portion (44) serves as the active gate portion. A portion of the gate oxide (26) adjacent the gate contact portion (43) is thickened to lower a gate to drain capacitance of the field effect transistor (10) and thereby increase a bandwidth of the insulated gate field effect transistor (10).

15 Claims, 8 Drawing Sheets

INSULATED GATE SEMICONDUCTOR DEVICE HAVING A CAVITY UNDER A PORTION OF A GATE STRUCTURE AND METHOD OF MANUFACTURE

FIELD OF THE INVENTION

The present invention relates, in general, to insulated gate semiconductor devices, and more particularly, to controlling a threshold voltage, $V_T$, and increasing a transconductance, $g_m$, of insulated gate semiconductor devices.

BACKGROUND OF THE INVENTION

As those skilled in the art are aware, $V_T$ is related to the voltage at which an insulated gate semiconductor device turns on and varies in accordance with the carrier concentration of the channel region. For example, the gate-source voltage ($V_{GS}$) of an N-channel insulated gate semiconductor device must exceed $V_T$ to form a channel in the insulated gate semiconductor device. Since the voltage at the gate is typically the input voltage of the insulated gate semiconductor device, the input voltage relative to the source voltage must exceed $V_T$ for a conducting channel to be formed. In other words, a significant drain current ($I_D$) will not flow through a channel region of the insulated gate semiconductor device unless $V_{GS}$ is greater than $V_T$. In addition, $V_T$ is important in determining the saturation current of an insulated gate semiconductor device, which in turn helps to determine the power bandwidth of the device.

Although precise control of $V_T$ is highly desirable in all insulated gate semiconductor device applications, it is particularly important in low voltage applications. In insulated gate semiconductor devices using standard power supply levels, the difference between the upper power supply rail (5 volts) and the lower power supply rail (0 volts) is sufficiently large, i.e., approximately 5 volts, that fluctuations in $V_T$ have a negligible effect on the device performance. However, in low voltage applications when the difference between the power supply rails is less than 1.5 volts, $V_T$ represents a substantial portion of the total power supply voltage. Consequently, fluctuations in $V_T$ result in large fluctuations of the current drive capability of the insulated gate semiconductor device.

Accordingly, it would be advantageous to have an insulated gate semiconductor device and method of manufacturing the insulated gate semiconductor device that provides control of the threshold voltage and minimization of the gate capacitance in low voltage, high bandwidth applications.

DETAILED DESCRIPTION OF THE DRAWINGS

Generally, the present invention provides an insulated gate semiconductor device and a method of fabricating or forming the insulated gate semiconductor device. Insulated gate semiconductor devices are also referred to as insulated gate field effect devices and insulated gate field effect transistors. The insulated gate semiconductor devices manufactured in accordance with the present invention comprise a heavily doped gate structure having a notch for outgassing of impurity materials or dopants from the heavily doped gate structure. The impurity materials that are outgassed flow across the cavity and dope a portion of a semiconductor material to form a lightly doped drain region. Thus, the lightly doped drain region is formed by autodoping the semiconductor material with impurity materials from the heavily doped gate structure. The lightly doped drain region serves to control the threshold voltage of the insulated gate semiconductor device. In addition, the bandwidth of the insulated gate field effect transistors is increased by thickening a portion of the gate oxide adjacent a drain region of the insulated gate field effect transistors.

It should be understood that the same reference numerals are used in the figures to denote the same elements. It shall be further understood that the materials, concentrations, and thicknesses provided in the description of the present invention merely serve as examples and are not limitations of the present invention.

Figure 1:
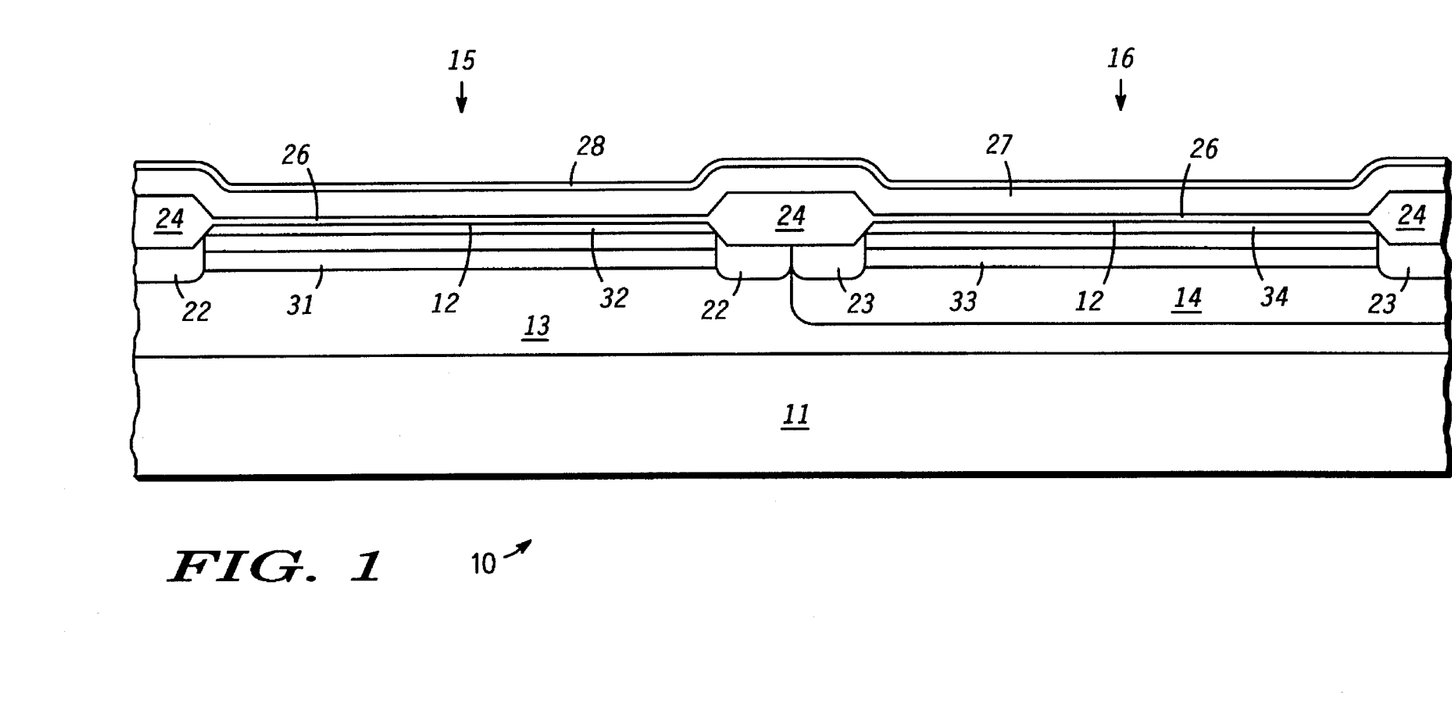
FIGS. 1–8 illustrate highly enlarged cross-sectional views of a portion of an insulated gate semiconductor device during processing in accordance with an embodiment of the present invention.

FIG. 1 illustrates an enlarged cross-sectional view of a portion of partially completed complementary insulated gate field effect transistors 10 during processing in accordance with a first embodiment of the present invention. Complementary insulated gate field effect transistors 10 include an N-channel transistor 15 fabricated in a portion of a P-type epitaxial layer 13 and a P-channel transistor 16 fabricated in a portion of an N-well 14. What is shown in FIG. 1 is a substrate 11 of P conductivity type having an epitaxial layer 13 disposed thereon. By way of example, epitaxial layer 13 is of P conductivity type, has a major surface 12, and ranges in thickness between approximately 2 microns (μm) and 5 μm. Using methods known in the art, an impurity well 14 of N conductivity type is formed in a portion of P-type epitaxial layer 13. Substrate 11 has, for example, a resistivity ranging from approximately 0.01 ohm-centimeter (Ω-cm) to approximately 0.1 Ω-cm, and P-type epitaxial layer 13 has a resistivity between approximately 6 Ω-cm and approximately 8 Ω-cm. P-type epitaxial layer 13 and N-well 14 have a surface concentration on the order of $5 \times 10^{15}$ atoms per cubic centimeter (atoms/cm$^3$). Although the description of the present invention includes the combination of substrate 11 and P-type epitaxial layer 13 to prevent latch-up, it should be understood that insulated gate field effect transistors of the present invention may be manufactured in a semiconductor material such as substrate 11. In addition, field implant regions 22 are formed in P-type epitaxial layer 13, field implant regions 23 are formed in N-well 14, and field oxide regions 24 are formed over field implant regions 22 and 23. Formation of epitaxial layers, dopant wells, field implant regions, and field oxide regions are well known to those skilled in the art.

A layer of dielectric material 26, which serves as a gate oxide layer, is formed on major surface 12 and on field oxide regions 24. Suitable techniques for forming gate oxide layer 26 include thermal oxidation, chemical vapor deposition, and the like. In accordance with the first embodiment of the present invention, gate oxide layer 26 has a thickness ranging between approximately 50 angstroms and approximately 150 angstroms. A layer of polysilicon 27 having a thickness ranging between approximately 400 angstroms and approximately 1,000 angstroms is formed on gate oxide layer 26. An insulating masking layer 28 having a thickness ranging between approximately 300 angstroms and approximately 700 angstroms is formed on polysilicon layer 27. Insulating masking layer 28 may be, for example, an oxide layer formed by decomposition of tetraethyl orthosilicate. By way of example, gate oxide layer 26 has a thickness of approximately 105 angstroms, polysilicon layer 27 has a thickness of approximately 550 angstroms, and oxide layer 28 has a thickness of approximately 300 angstroms.

Still referring to FIG. 1, a layer of photoresist (not shown) is formed on the portions of insulating masking layer 28 over N-well 14. The layer of photoresist serves as an implant block mask to prevent impurity materials from being implanted into N-well 14. An enhanced dopant region 31 is formed by doping a portion of P-type epitaxial layer 13 with an impurity material of P conductivity type such as, for example, boron. Enhanced dopant region 31 is also referred to as an enhanced dopant layer or a dopant layer. More particularly, the boron is implanted into a portion of P-type epitaxial layer 13 to form dopant region 31. It should be noted that dopant region 31 is spaced apart from major surface 12. A suitable set of implant parameters includes implanting the P type impurity material at a dose ranging from approximately $5 \times 10^{11}$ atoms/cm$^2$ to approximately $5 \times 10^{12}$ atoms/cm$^2$ and an implant energy ranging from approximately 40 KeV to approximately 100 KeV. Thus, the boron that forms dopant region 31 is implanted into P-type epitaxial layer 13 to a depth or distance ranging between approximately 1,000 and approximately 3,000 angstroms. The impurity materials or dopant forming dopant region 31 serves to provide punch-through protection for N-channel transistor 15.

An enhanced dopant region 32 is formed by doping another portion of P-type epitaxial layer 13 with boron. Enhanced dopant region 32 is also referred to as an enhanced dopant layer or a dopant layer. By way of example, implant parameters for the formation of dopant region 32 include a dose ranging from approximately $5 \times 10^{11}$ atoms/cm$^2$ to approximately $1 \times 10^{13}$ atoms/cm$^2$ and a suitable implant energy ranging from approximately 20 KeV to approximately 40 KeV. Thus, the boron that forms dopant region 32 is implanted into a portion of P-type epitaxial layer 13 to a depth or distance ranging from approximately 200 to approximately 1,200 angstroms. The impurity materials forming dopant region 32 serve to adjust the threshold voltage of N-channel transistor 15. The layer of photoresist is removed and a layer of photoresist (not shown) is formed on portions of masking layer 28 over P-type epitaxial layer 13. This layer of photoresist also serves as an implant block mask to prevent impurity materials from being implanted into P-type epitaxial layer 13.

An enhanced dopant region 33 is formed by doping a portion of N-well 14 with an impurity material of N conductivity type such as, for example, phosphorus. Enhanced dopant region 33 is also referred to as an enhanced dopant layer or a dopant layer. More particularly, the phosphorus is implanted into N-well 14 to form dopant region 33. It should be noted that dopant region 33 is spaced apart from surface 12. A suitable set of implant parameters includes implanting the N type impurity material at a dose ranging from approximately $5 \times 10^{11}$ atoms/cm$^2$ to approximately $5 \times 10^{12}$ atoms/cm$^2$ at an implant energy ranging from approximately 80 KeV to approximately 200 KeV. Thus, the N type impurity material of the implant step that forms dopant region 33 is implanted into N-well 14 to a depth or distance ranging from approximately 1,000 to approximately 3,000 angstroms. The impurity materials forming dopant region 33 serve to provide punch-through protection for P-channel transistor 16.

An enhanced dopant region 34 is formed by doping another portion of N-well 14 with phosphorus. Enhanced dopant region 34 is also referred to as an enhanced dopant layer or a dopant layer. By way of example, the boron is implanted into N-well 14 to form dopant region 34. Suitable implant parameters for the formation of dopant region 34 include a dose ranging from approximately $5 \times 10^{11}$ atoms/cm$^2$ to approximately $1 \times 10^{13}$ atoms/cm$^2$ and a suitable implant energy ranging from approximately 80 KeV to approximately 160 KeV. Thus, the N type impurity material of the implant step that forms dopant region 34 is implanted into N-well 14 to a depth or distance ranging from approximately 200 to approximately 1,200 angstroms. The impurity materials forming dopant region 34 serve to adjust the threshold voltage of P-channel transistor 16. The layer of photoresist is removed.

Figure 2:
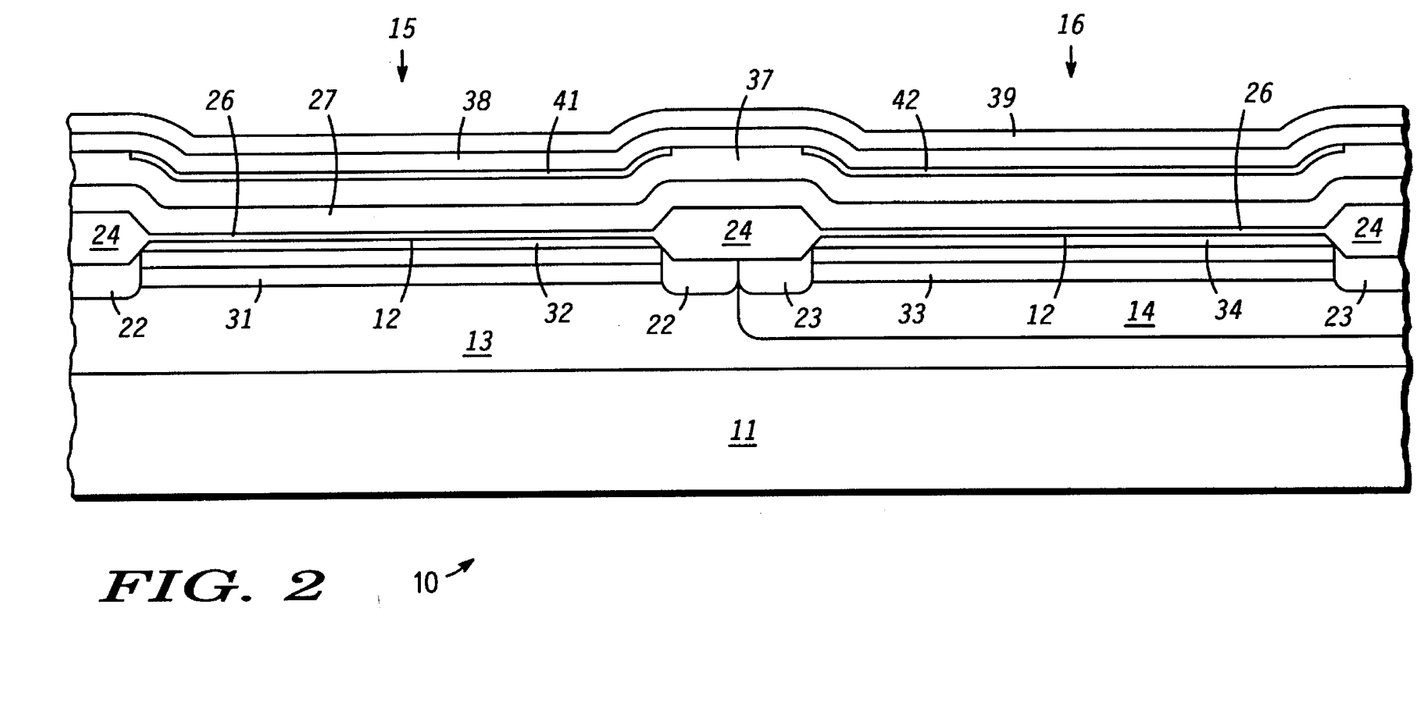

Now referring to FIG. 2, oxide layer 28 is removed from polysilicon layer 27 using, for example, an isotropic wet etch comprising hydrofluoric acid. A layer of polysilicon 37 having a thickness of approximately 3,000 angstroms is formed on layer of polysilicon 27. It should be noted that the thickness of layer of polysilicon 37 is not a limitation of the present invention and that a suitable range of thicknesses for layer of polysilicon 37 is between approximately 2,000 angstroms and approximately 5,000 angstroms. A layer of dielectric material 38 such as, for example, nitride, is formed on layer of polysilicon 37. By way of example, nitride layer 38 has a thickness of approximately 500 angstroms; however, a suitable range of thicknesses for layer of insulating material 38 is between approximately 250 angstroms and approximately 750 angstroms. A layer of dielectric material 39 is formed on nitride layer 38, wherein dielectric material 39 serves as an implant protect oxide. By way of example, layer of dielectric material 39 is an oxide layer formed by the decomposition of tetraethyl orthosilicate and has a thickness of approximately 300 angstroms. A suitable thickness range for oxide layer 39 is between approximately 200 angstroms and approximately 400 angstroms.

Figure 3:
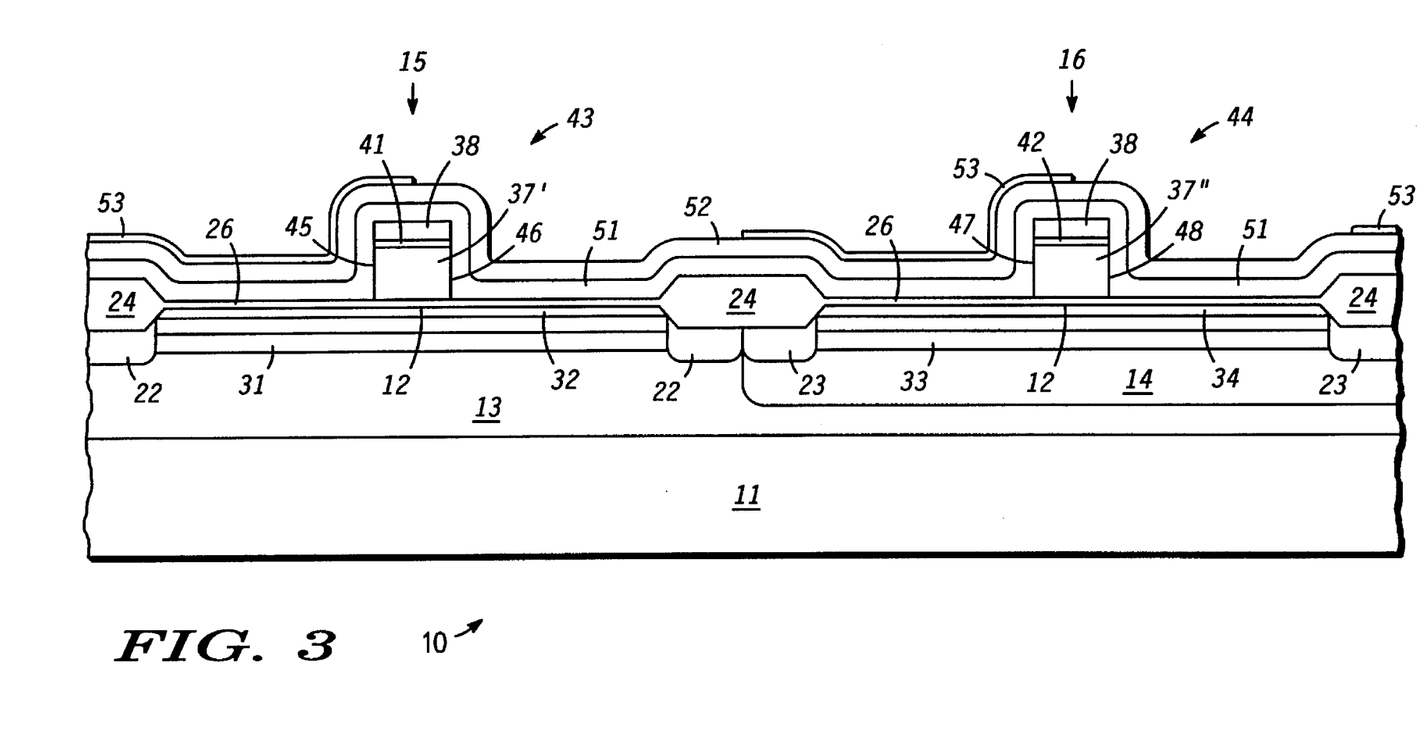

A layer of photoresist (not shown) is formed on the portions of oxide layer 39 over N-well 14. The layer of photoresist serves as an implant block mask to prevent impurity materials from being implanted into N-well 14. An impurity material of P conductivity type such as, for example, boron is implanted into polysilicon layer 37 to form dopant layer 41. A suitable set of implant parameters includes implanting the boron at a dose ranging between approximately $1 \times 10^{15}$ atoms/cm$^2$ and approximately $5 \times 10^{15}$ atoms/cm$^2$ at an implant energy ranging between approximately 80 KeV and approximately 160 KeV. Thus, the phosphorus forming dopant layer 41 is implanted into polysilicon layer 37 to a depth or distance ranging between approximately 500 and approximately 3,000 angstroms. The impurity materials or dopants forming dopant layer 41 diffuse through the portions of layers of polysilicon 37 and 27 during subsequent processing steps (FIG. 3). Thus, dopant layer 41 serves as a dopant source.

The layer of photoresist is removed and another layer of photoresist (not shown) is formed on the portions of nitride layer 39 over P-type epitaxial layer 13. The layer of photoresist serves as an implant block mask to prevent impurity materials from being implanted into P-type epitaxial layer 13. An impurity material of N conductivity type is implanted into polysilicon layer 37 to form dopant layer 42. A suitable set of implant parameters includes implanting phosphorus at a dose ranging between approximately $1 \times 10^{15}$ atoms/cm$^2$ and approximately $1 \times 10^{16}$ atoms/cm$^2$ and an implant energy ranging between approximately 40 KeV and approximately 160 KeV. Thus, the boron forming dopant layer 42 is implanted into polysilicon layer 37 to a depth or distance ranging between approximately 500 and 3,000 angstroms. The impurity materials or dopants forming dopant layer 42 diffuse through the portions of polysilicon layers 37 and 27 during subsequent processing steps. Thus, dopant layer 42 serves as a dopant source. The layer of photoresist is removed. In addition, oxide layer 39 is removed using, for example, a wet etch.

Now referring to FIG. 3, a layer of photoresist (not shown) is deposited on nitride layer 38 and patterned to form etch protection structures (not shown). Nitride layer 38, and polysilicon layers 27 and 37 are anisotropically etched to form gate structures 43 and 44 having the respective sides 45, 46, 47, and 48. It should be noted that since layers of polysilicon 27 and 37 become indistinguishable from one another, i.e., they form a unitary layer, they are identified by the reference numerals 37' and 37" in gate structures 43 and 44, respectively. The anisotropic etch step forming gate structures 43 and 44 stops on or in gate oxide layer 26. The layer of photoresist is removed.

A conformal layer of dielectric material 51 having a thickness of approximately 300 angstroms is formed on gate structures 43 and 44 and the exposed portions of gate oxide layer 26. By way of example, layer of dielectric material 51 is oxide formed by the decomposition of tetraethyl orthosilicate. It should be noted that oxide layer 51 may have a thickness ranging between approximately 100 angstroms and approximately 500 angstroms. Oxide layer 51 is thermally annealed. It should be understood that the step of thermally annealing oxide layer 51 uniformly distributes the impurities in polysilicon regions 37' and 37", respectively.

A conformal layer of dielectric material 52 is formed on oxide layer 51. More particularly, layer of dielectric material 52 is nitride having a thickness ranging between approximately 250 angstroms and approximately 750 angstroms. A nominal thickness of nitride layer 52 is approximately 500 angstroms. A layer of photoresist 53 is deposited on conformal nitride layer 52. Layer of photoresist 53 is removed from the portions of nitride layer 52 on top of gate structures 43 and 44, as well as from the portions of nitride layer 52 adjacent sides 46 and 48 of the respective gate structures 43 and 44, and from the portions of nitride layer 52 adjacent sides 46 and 48 of the respective gate structures 43 and 44. Thus, portions of nitride layer 52 on top of gate structures 43 and 44, along sides 46 and 48 and adjacent sides 46 and 48 are exposed. The exposed portions of nitride layer 52 are removed using an isotropic plasma etch technique. In addition, the portions of the oxide layer 51 below the exposed portions of nitride layer 52 are also removed by an isotropic etch technique, e.g., a hydrofluoric acid etch. Further, an overetch is performed to undercut portions of polysilicon regions 37' and 37", thereby forming cavities 60 and 61 (FIG. 4) respectively. It should be noted that cavities 60 and 61 are also referred to as notches and gaps.

Figure 4:
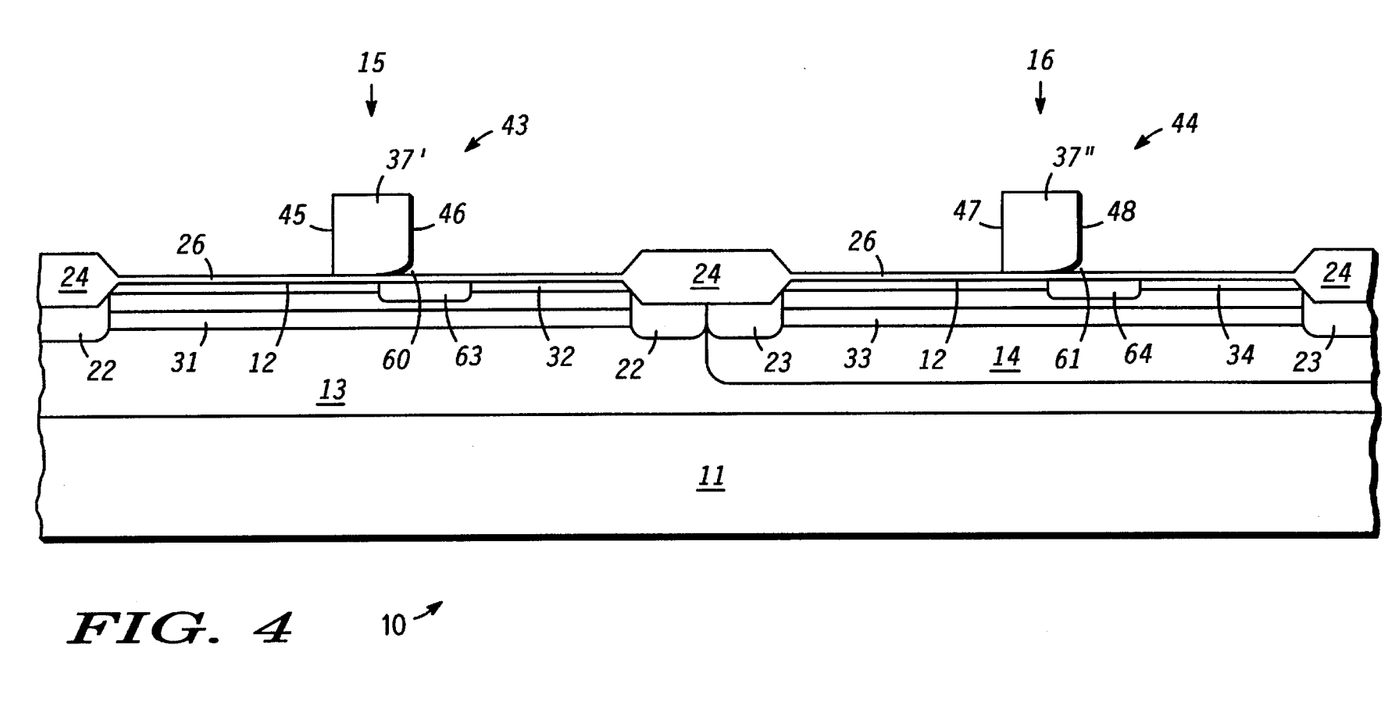

Now referring to FIG. 4, polysilicon regions 37' and 37" are heavily doped and serve as dopant sources for doping portions of the respective dopant wells 13 and 14. More particularly, dopant from polysilicon region 37' outgasses, crosses cavity 60, and autodopes a portion of P-type epitaxial layer 13, thereby forming a dopant region 63. Likewise, dopant from polysilicon region 37" outgasses, crosses cavity 61, and autodopes a portion of N-well 14, thereby forming a dopant region 64. Dopant regions 63 and 64 serve as lightly doped drain regions.

Figure 5:
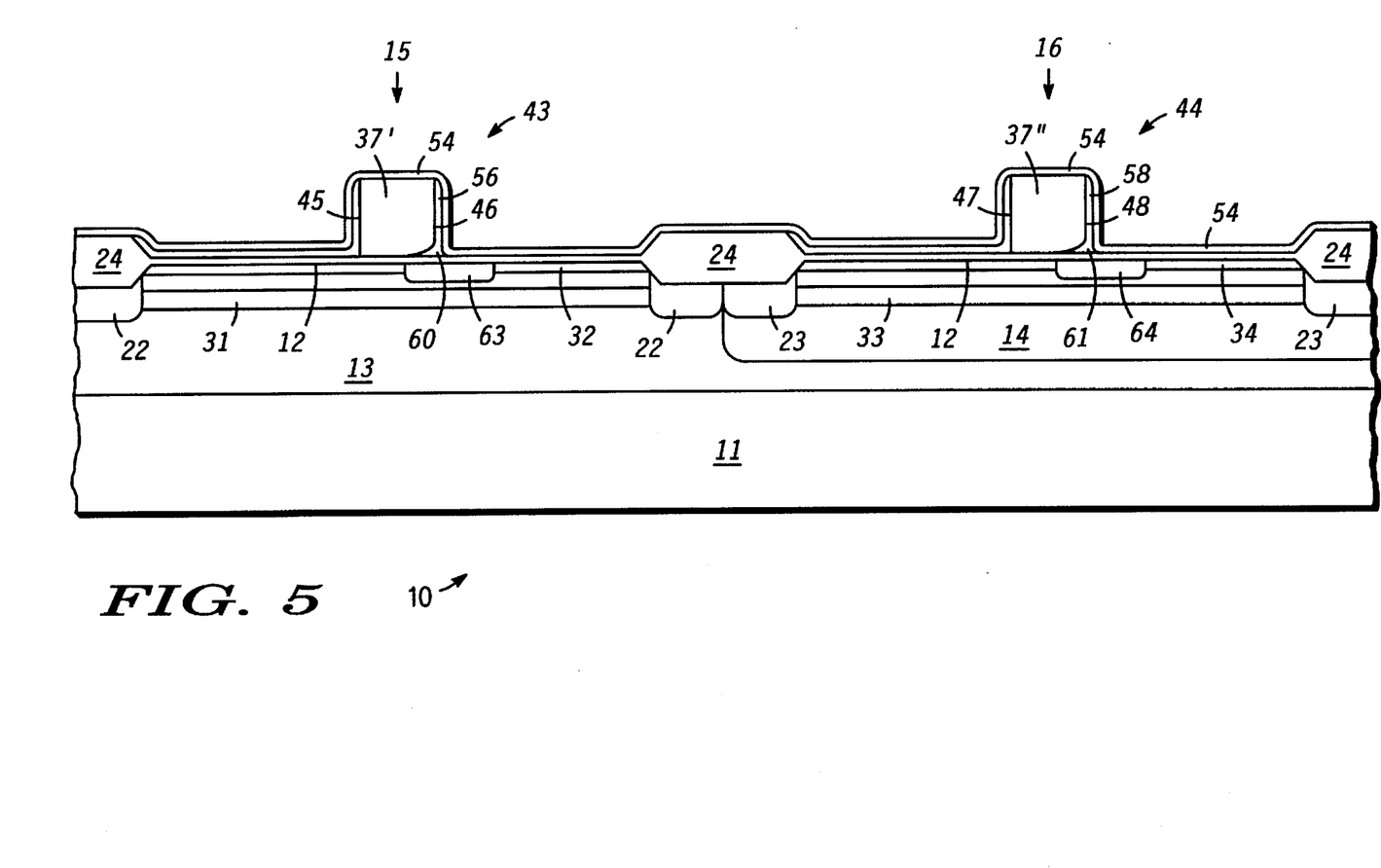

Now referring to FIG. 5, layers of oxide are formed on the exposed portions of polysilicon regions 37 and 37", respectively. More particularly, oxide layers 56 and 58 are formed on the respective sides 46 and 48 by, for example, thermal oxidation. A suitable range of thicknesses for layers of oxide 56 and 58 is between approximately 200 angstroms and approximately 400 angstroms, and a nominal thickness of oxide layers 56 and 58 is approximately 300 angstroms. It should be noted that oxide layers 56 and 58 are also formed on the undercut portions of polysilicon 37' and 37", thereby filling cavities 60 and 61, respectively. The portions of oxide layers 56 and 58 formed on the undercut portions of polysilicon regions 37' and 37" cooperate with the adjacent portions of gate oxide layer 26 to form thick portions of gate oxide between the portions of polysilicon regions 37' and 37" and portions of major surface 12.

The remaining portions of nitride layer 52 are removed from oxide layer 51. In addition, the portions of oxide layer 51 and the remaining portions of nitride layer 38 are removed from polysilicon regions 37' and 37". An oxide layer 54 is formed on the exposed portions of polysilicon regions 37' and 37" and on the remaining portions of oxide 51. Oxide layer 54 serves as an implant protect mask to protect polysilicon regions 37' and 37" from damage during the source/drain implants.

Figure 6:
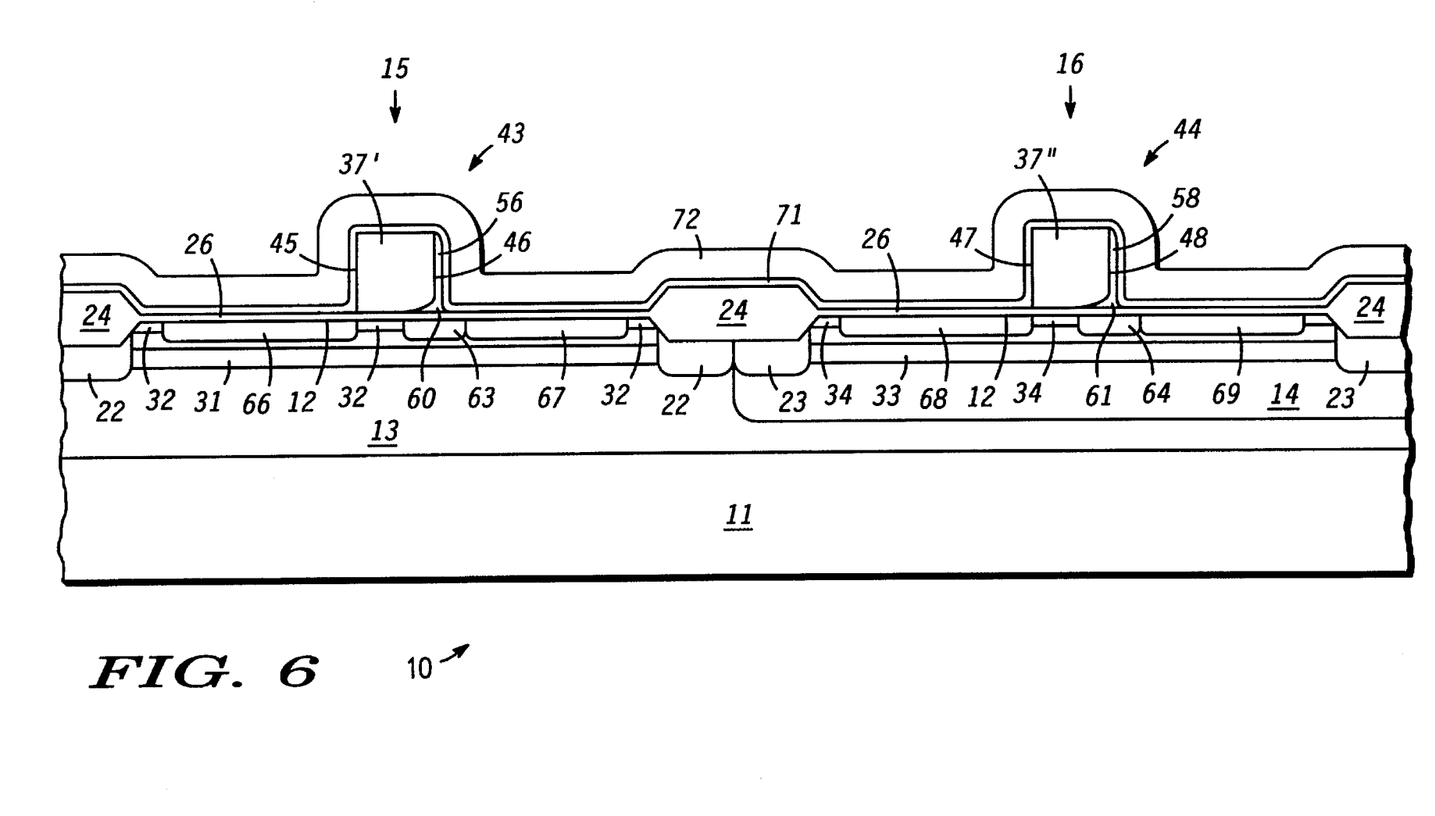

Now referring to FIG. 6, a layer of photoresist (not shown) is formed on the portions of oxide layer 54 above N-well 14. The layer of photoresist serves as an implant block mask to define the source and drain regions of P-type epitaxial layer 13. It should be noted that an implant block mask is not formed on gate structure 43, thereby allowing doping of polysilicon region 37' of gate structure 43 during the source/drain implant. In other words, the layer of photoresist serves as an implant block mask to prevent impurity materials from being implanted into N-well 14 and gate structure 44. A source/drain implant is performed to form a source region 66 and a drain region 67. In addition, the source/drain implant dopes gate structure 43. A suitable set of implant parameters for the source/drain implant includes implanting an N type impurity material such as arsenic, at a dose ranging between approximately $1 \times 10^{15}$ atoms/cm$^2$ and approximately $1 \times 10^{16}$ atoms/cm$^2$ and an implant energy ranging between approximately 60 KeV and approximately 160 KeV.

The layer of photoresist over N-well 14 is removed and a layer of photoresist (not shown) is formed on the portions of oxide layer 54 above P-type epitaxial layer 13. The layer of photoresist serves as an implant block mask to define the source and drain regions of N-well 14. It should be noted that an implant block mask is not formed on gate structure 44, thereby allowing doping of polysilicon region 37" of gate structure 44 during the source/drain implant. In other words, the layer of photoresist serves as an implant block mask to prevent impurity materials from being implanted into P-well 13 and gate structure 43. A source/drain implant is performed to form a source region 68 and a drain region 69. A suitable set of implant parameters for the source/drain implant includes implanting a P type impurity material such as boron, at a dose ranging between approximately $1 \times 10^{15}$ atoms/cm$^2$ and approximately $5 \times 10^{15}$ atoms/cm$^2$, and a suitable implant energy ranges between approximately 5 KeV and approximately 15 KeV. The layer of photoresist is removed.

Still referring to FIG. 6, oxide layer 54 is removed using an isotropic etch. A conformal layer of insulating material 71 is formed on the exposed portions of polysilicon regions 37' and 37", the remaining portions of oxide layer 38, and on oxide layers 56 and 58. By way of example layer of insulating material 71 is oxide formed by the thermal decomposition of tetraethyl orthosilicate and has a thickness of approximately 300 angstroms. It should be noted that the thickness of oxide layer 71 may range between approximately 100 angstroms and approximately 400 angstroms. A conformal layer of dielectric material 72 is formed on oxide layer 71. In accordance with layer 71 being oxide, layer of dielectric material 72 is nitride having a thickness of approximately 2,000 angstroms. Nitride layer 72 may have a thickness ranging between approximately 1,000 angstroms and approximately 2,250 angstroms.

Figure 7:
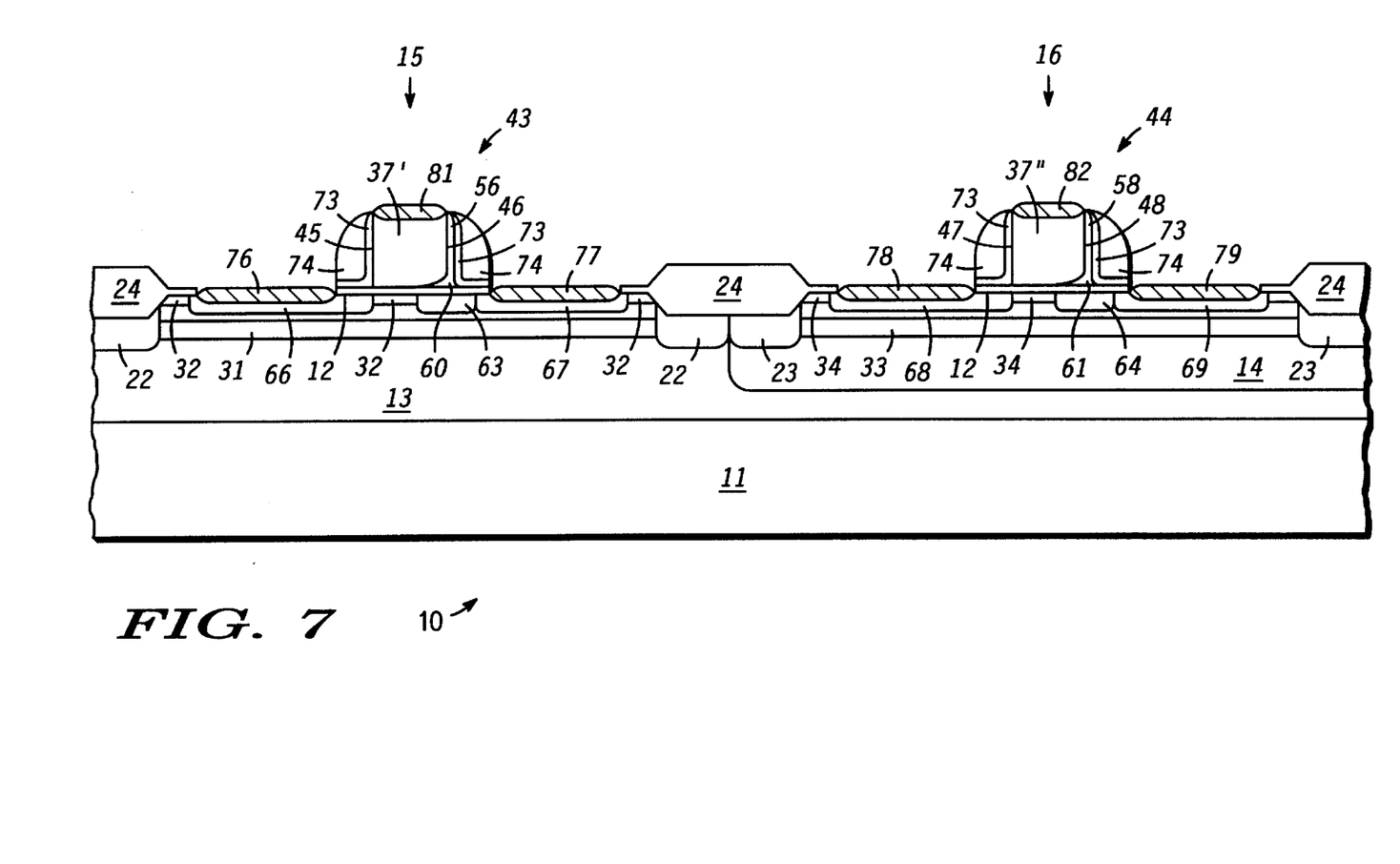

Now referring to FIG. 7, silicon nitride layer 72 and oxide layer 71 are anisotropically etched to form oxide spacers 73 and nitride spacers 74 adjacent the respective sides 45, 46, 47, and 48. In addition, the anisotropic etch step exposes the portions of major surface 12 adjacent spacers 74 and portions of polysilicon regions 37' and 37". Using techniques well known to those skilled in the art, a silicide 76 is formed on major surface 12 of dopant region 66, a silicide 77 is formed on major surface 12 of dopant region 67, a silicide 81 is formed on the exposed portion of gate structure 43, a silicide 78 is formed on major surface 12 of dopant region 68, a silicide 79 is formed on major surface 12 of dopant region 69, and a silicide 82 is formed on the exposed portion of gate structure 44.

Figure 8:
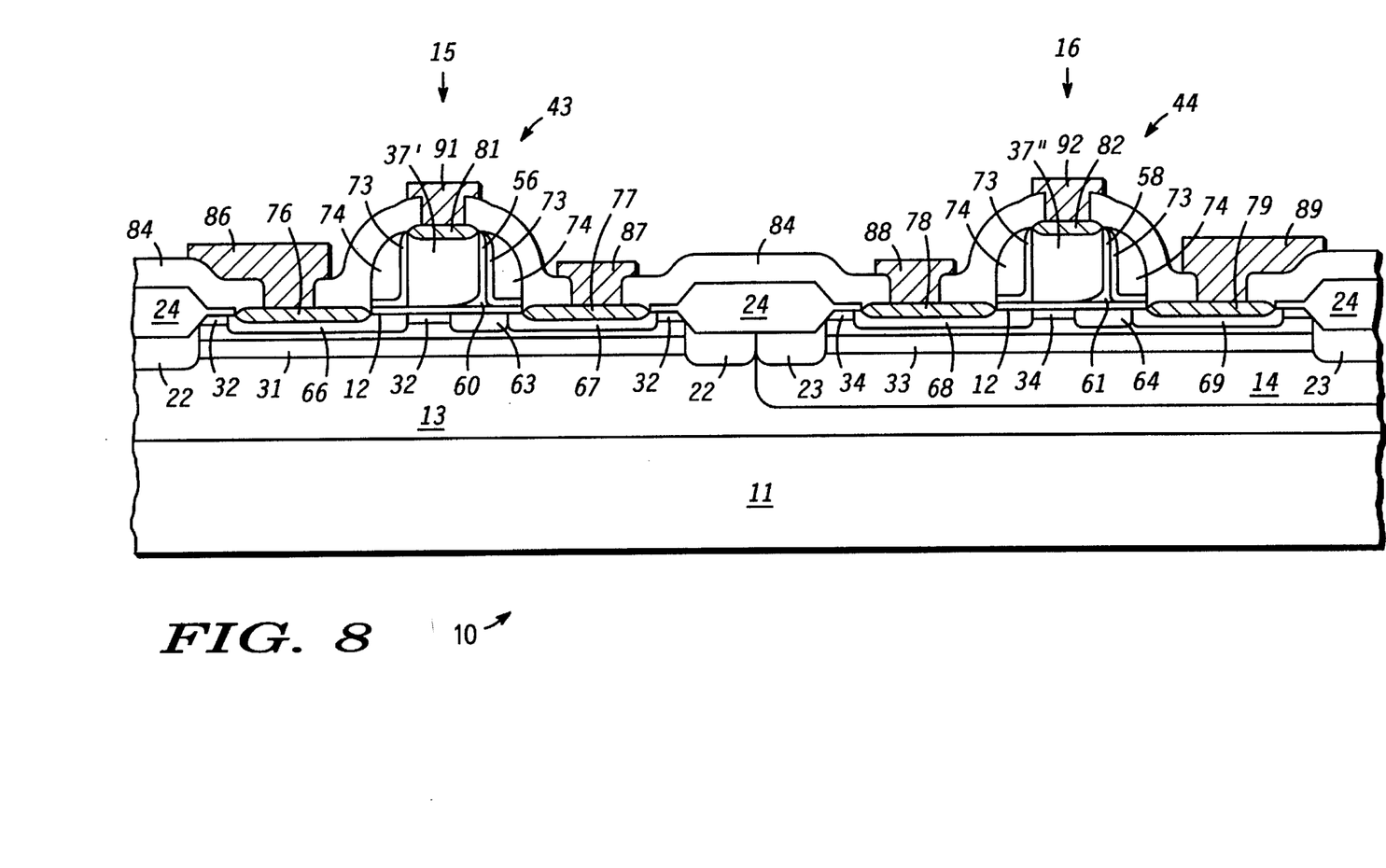

Now referring to FIG. 8, a layer of dielectric material 84, such as, for example, oxide is formed on field oxide regions 24, spacers 74, and silicide 76, 77, 78, 79, 81, and 82. Openings are formed in oxide layer 84 to expose portions of silicide 76, 77, 78, 79, 81, and 82. Using techniques well known in the art electrical conductors are formed which contact the exposed silicide. More particularly, a source conductor 86 contacts silicide 76, a drain conductor 87 contacts silicide 77, and a gate conductor 91 contacts silicide 81. Thus, source, drain, and gate conductors 86, 87, and 91, respectively, form conductors for N-channel transistor 15. Likewise, a source conductor 88 contacts silicide 78, a drain conductor 89 contacts silicide 79, and a gate conductor 92 contacts silicide 82. Thus, source, drain, and gate conductors 88, 89, and 92, respectively, form conductors for P-channel transistor 16.

By now it should be appreciated that an insulated gate semiconductor device and a method of manufacturing the insulated gate semiconductor device have been provided. Two important features of the present invention are that the insulated gate semiconductor devices have a thicker gate oxide at a drain end than at a source end (e.g., 400 angstroms and 105 angstroms, respectively) and they have a lightly doped drain region that is formed by autodoping from a gate structure. Thus, these devices are non-symmetric and have a reduced effective gate length. Further, devices of the present invention have an increased transconductance, a decreased gate to drain capacitance, and an increased breakdown voltage over devices lacking these features. In addition, devices formed in accordance with the present invention have an operating speed that is at least approximately 25 percent greater than devices without these features.

We claim:

1. A method for fabricating an insulated gate semiconductor device, comprising the steps of:

providing a semiconductor material of a first conductivity type and having a major surface;

forming at least one enhanced dopant region of the first conductivity type in a first portion of the semiconductor material;

forming a first layer of dielectric material on the major surface;

forming a first gate structure on the first layer of dielectric material, the first gate structure having first and second sides;

forming a first cavity extending under a portion of the first gate structure from the first side of the first gate structure and exposing a portion of the major surface;

forming a first dopant region in the semiconductor material adjacent the first cavity and extending into the semiconductor material from the major surface;

forming a second layer of dielectric material which fills the first cavity;

forming a second dopant region in a second portion of the semiconductor material, the second dopant region of a second conductivity type opposite to the first conductivity type and aligned to the first side of the first gate structure; and forming a third dopant region in a third portion of the semiconductor material, the third dopant region of the second conductivity type and aligned to the second side of the first gate structure.

2. The method of claim 1, wherein the step of forming a first dopant region and the step of forming a second dopant region includes simultaneously forming the first dopant region, forming the second dopant region, and doping the first gate structure.

3. The method of claim 1, wherein the step of forming a third dopant region includes autodoping a portion of the semiconductor material adjacent the first cavity.

4. The method of claim 1, wherein the step of forming the first gate structure includes forming the first gate structure from polysilicon and doping the polysilicon with impurities of the second conductivity type.

5. The method of claim 4, wherein the step of forming a second layer of dielectric material includes thermally oxidizing a portion of the first gate structure adjacent the first cavity.

6. The method of claim 1, further including the steps of:

forming a dopant well of the second conductivity type in a second portion of the semiconductor material;

forming at least one enhanced dopant region of the second conductivity type in a first portion of the dopant well;

forming a second gate structure on a second portion the first layer of dielectric material, the second gate structure having first and second sides, and wherein the second portion of the first layer of dielectric material is above the dopant well;

forming a second cavity extending under a portion of the second gate structure from the first side of the second gate structure and exposing a second portion of the major surface;

forming a fourth dopant region in the dopant well adjacent the second cavity and extending into the dopant well from the major surface;

forming a third layer of dielectric material which fills the second cavity;

forming a fifth dopant region in a second portion of the dopant well, the fifth dopant region of the first conductivity type and aligned to the first side of the second gate structure; and forming a sixth dopant region in a third portion of the dopant well, the sixth dopant region of the second conductivity type and aligned to the second side of the second gate structure.

7. The method of claim 6, wherein the step of forming the second gate structure includes forming the second gate structure from polysilicon and doping the polysilicon with impurities of the first conductivity type.

8. The method of claim 6, wherein the step of forming a fourth dopant region includes autodoping a portion of the dopant well adjacent the second cavity.

9. The method of claim 6, further including forming the first and second gate structures from a portion of a first layer of polysilicon disposed on a portion of a second layer of polysilicon.

10. A method of forming an insulated gate semiconductor device, comprising the steps of:

providing a semiconductor material of a first conductivity type and having a major surface;

forming at least one dopant layer of a first conductivity type in a portion of the semiconductor material;

forming a layer of dielectric material on the major surface;

forming a first gate structure on a first portion of the layer of dielectric material, the first gate structure having first and second sides and a first notch adjacent the first portion of the layer of dielectric material and extending under the first gate structure from the first side of the first gate structure;

autodoping a first portion of the semiconductor material adjacent the first notch; and doping second and third portions of the semiconductor material, the second portion of the semiconductor material adjacent the first side of the first gate structure, the third portion of the semiconductor material adjacent the second side of the first gate structure.

11. The method of claim 10, wherein the step of forming the first gate structure includes doping the first gate structure.

12. The method of claim 11, wherein the step of doping the first gate structure includes doping the first gate structure with impurities of the second conductivity type.

13. The method of claim 10, wherein the step of doping second and third portions of the semiconductor material includes filling a portion of the first notch with a dielectric material.

14. The method of claim 10, wherein the step of forming at least one dopant layer of the second conductivity type in the semiconductor material includes forming two dopant layers, a first of the two dopant layers positioned further in the semiconductor material than a second of the two dopant layers.

15. The method of claim 10, further including the steps of:

forming a dopant well of the second conductivity type in another portion of the semiconductor material;

forming a first dopant layer of the second conductivity type in a portion of the dopant well;

forming a second gate structure on a second portion of the layer of dielectric material, the second gate structure having first and second sides and a second notch adjacent the second portion of the layer of dielectric material over the dopant well and extending under the second gate structure from the first side of the second gate structure;

autodoping a first portion of the dopant well adjacent the second notch; and doping second and third portions of the dopant well, the second portion of the dopant well adjacent the first side of the second gate structure, the third portion of the dopant well adjacent the second side of the second gate structure.

* * * * *